United States Patent
Hayakawa et al.

(10) Patent No.: US 9,252,562 B2
(45) Date of Patent: Feb. 2, 2016

(54) SURFACE EMITTING SEMICONDUCTOR LASER, SURFACE EMITTING SEMICONDUCTOR LASER ARRAY, SURFACE EMITTING SEMICONDUCTOR LASER DEVICE, OPTICAL TRANSMISSION DEVICE, INFORMATION PROCESSING APPARATUS, AND METHOD OF PRODUCING SURFACE EMITTING SEMICONDUCTOR LASER

(71) Applicant: FUJI XEROX CO., LTD., Tokyo (JP)

(72) Inventors: Junichiro Hayakawa, Kanagawa (JP); Kazutaka Takeda, Kanagawa (JP); Akemi Murakami, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 23 days.

(21) Appl. No.: 14/275,227

(22) Filed: May 12, 2014

(65) Prior Publication Data
US 2015/0099317 A1    Apr. 9, 2015

(30) Foreign Application Priority Data
Oct. 7, 2013  (JP) ................. 2013-209907

(51) Int. Cl.
H01S 5/024    (2006.01)
H04B 10/50    (2013.01)
H01S 5/183    (2006.01)
(Continued)

(52) U.S. Cl.
CPC ...... *H01S 5/02476* (2013.01); *G03G 15/04072* (2013.01); *H01S 5/18311* (2013.01); *H01S 5/423* (2013.01); *H04B 10/503* (2013.01); *H01L 33/04* (2013.01); *H01L 33/06* (2013.01); *H01L 33/10* (2013.01); *H01L 33/38* (2013.01); *H01L 33/385* (2013.01); *H01L 33/387* (2013.01);
(Continued)

(58) Field of Classification Search
CPC ................ H01S 5/18327; H01S 5/183; G03G 15/04072; H04B 10/503; H01L 33/06; H01L 33/04; H01L 33/10; H01L 33/38; H01L 33/385; H01L 33/387; H01L 33/64; H01L 33/642; H01L 33/644
USPC ........................................ 438/27, 22; 372/50
See application file for complete search history.

(56) References Cited

U.S. PATENT DOCUMENTS 6,156,581 A * 12/2000 Vaudo et al. ..................... 438/22
8,451,706 B2 * 5/2013 Kondo ........................... 369/121

(Continued)

FOREIGN PATENT DOCUMENTS

| JP | A-2003-86895 | 3/2003 |
| JP | A-2007-53243 | 3/2007 |
| JP | A-2008-311491 | 12/2008 |

Primary Examiner — Peniel M Gumedzoe
(74) Attorney, Agent, or Firm — Oliff PLC

(57) ABSTRACT

A surface emitting semiconductor laser includes a substrate, a first conductivity-type first semiconductor multilayer reflector, an active layer, a semiconductor layer, a second conductivity-type second semiconductor multilayer reflector that includes a current confinement layer, and a heat dissipating metal member. At least the first semiconductor multilayer reflector, the active layer, the semiconductor layer, and the second semiconductor multilayer reflector are stacked in this order on the substrate. A columnar structure having a top portion, a side surface, and a bottom portion is formed from the second semiconductor multilayer reflector to the semiconductor layer. The heat dissipating metal member is connected to the semiconductor layer exposed at the bottom portion of the columnar structure.

19 Claims, 12 Drawing Sheets

(51) Int. Cl.
*G03G 15/04* (2006.01)
*H01S 5/42* (2006.01)
*H01L 33/64* (2010.01)
*H01L 33/10* (2010.01)
*H01L 33/38* (2010.01)
*H01L 33/06* (2010.01)
*H01L 33/04* (2010.01)
*H01S 5/042* (2006.01)

(52) U.S. Cl.
CPC ............... *H01L33/64* (2013.01); *H01L 33/642* (2013.01); *H01S 5/0425* (2013.01); *H01S 5/18352* (2013.01)

(56) References Cited

U.S. PATENT DOCUMENTS

| | | | |
|---|---|---|---|
| 8,897,328 B2* | 11/2014 | Yoshida et al. | 372/36 |
| 2002/0074556 A1* | 6/2002 | Kwak et al. | 257/79 |
| 2004/0008747 A1* | 1/2004 | Nakayama et al. | 372/46 |
| 2005/0271113 A1* | 12/2005 | Song et al. | 372/98 |
| 2006/0227835 A1* | 10/2006 | Ueki et al. | 372/50.124 |
| 2008/0043793 A1* | 2/2008 | Ueki et al. | 372/38.05 |
| 2009/0135872 A1* | 5/2009 | Uchida et al. | 372/44.01 |

* cited by examiner

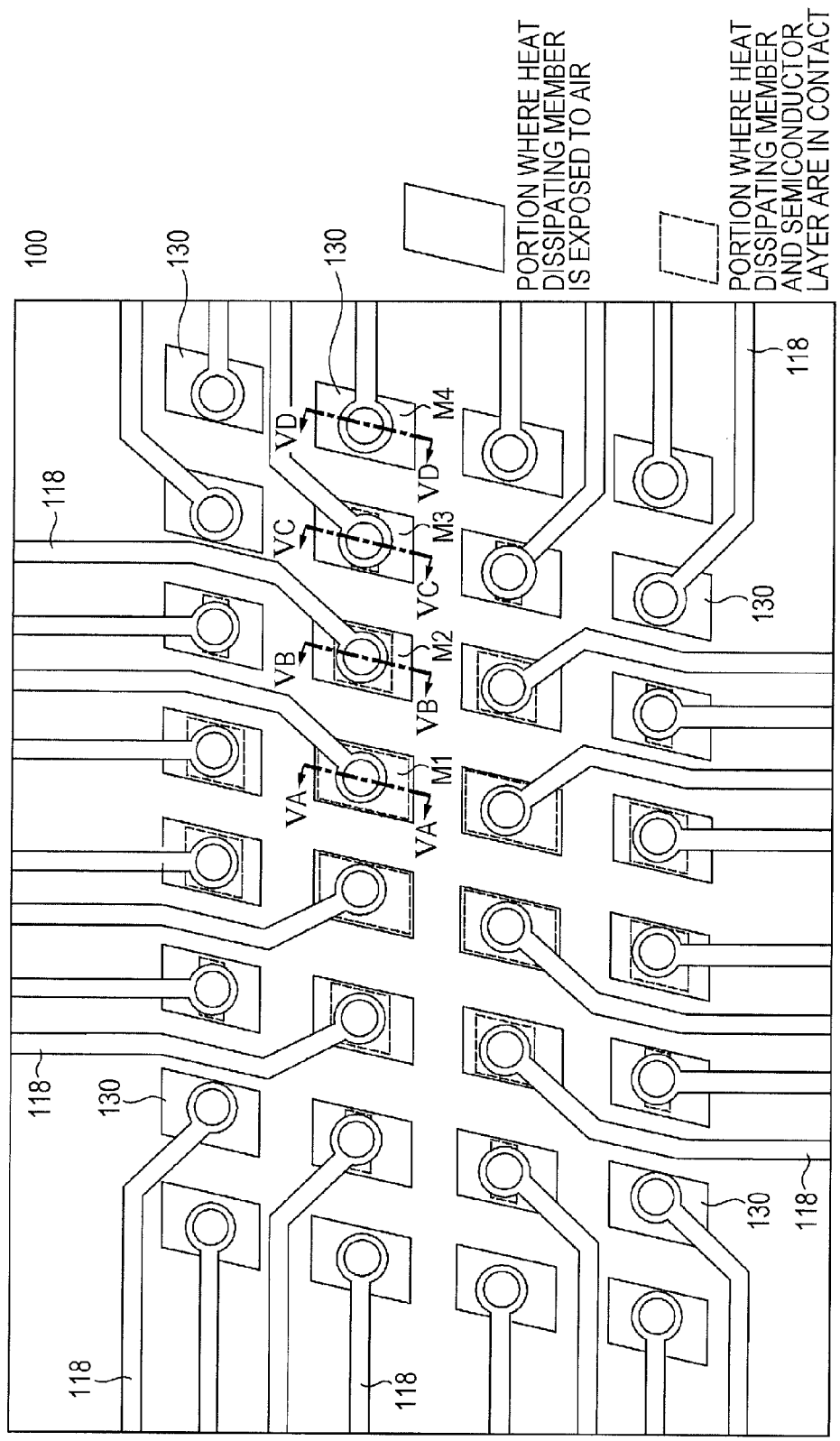

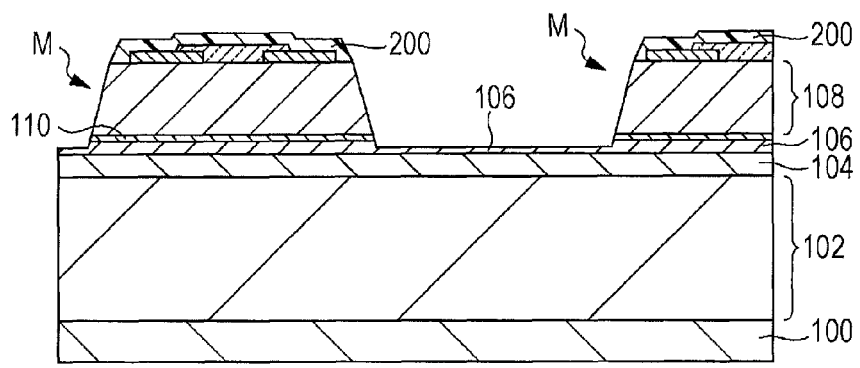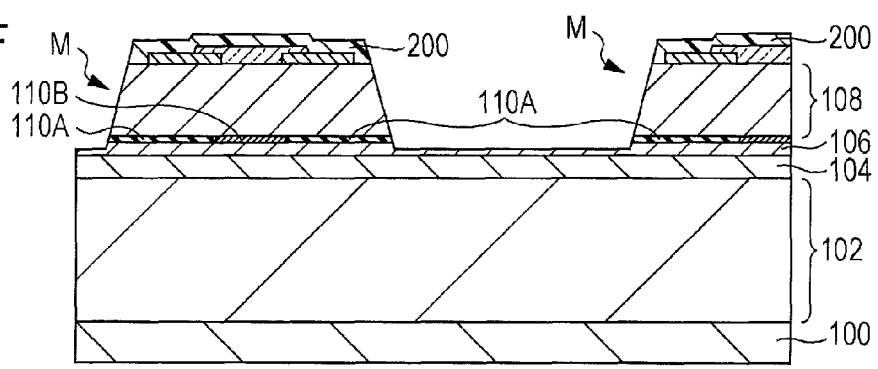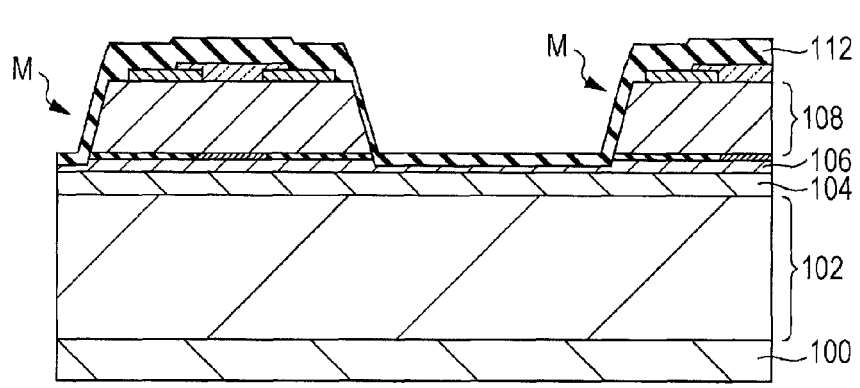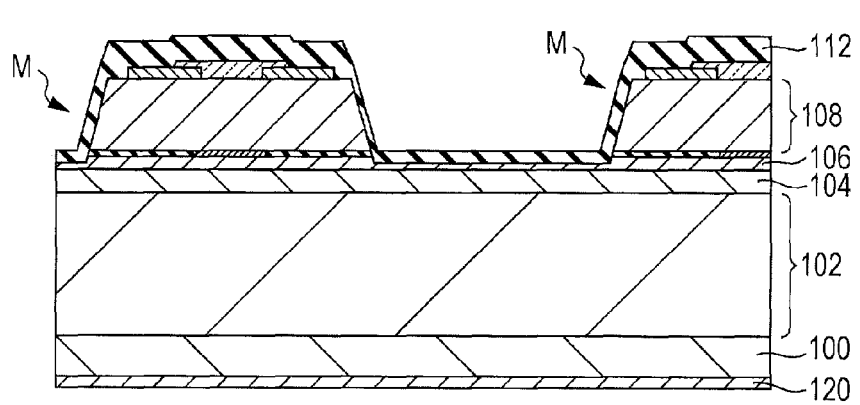

US 9,252,562 B2

SURFACE EMITTING SEMICONDUCTOR LASER, SURFACE EMITTING SEMICONDUCTOR LASER ARRAY, SURFACE EMITTING SEMICONDUCTOR LASER DEVICE, OPTICAL TRANSMISSION DEVICE, INFORMATION PROCESSING APPARATUS, AND METHOD OF PRODUCING SURFACE EMITTING SEMICONDUCTOR LASER

CROSS-REFERENCE TO RELATED APPLICATIONS

This application is based on and claims priority under 35 USC 119 from Japanese Patent Application No. 2013-209907 filed Oct. 7, 2013.

BACKGROUND (i) Technical Field

The present invention relates to a surface emitting semiconductor laser, a surface emitting semiconductor laser array, a surface emitting semiconductor laser device, an optical transmission device, an information processing apparatus, and a method of producing the surface emitting semiconductor laser.

(ii) Related Art

In surface emitting semiconductor lasers, laser output may be extracted in a direction perpendicular to substrates. Furthermore, the surface emitting semiconductor lasers are easily arranged in an array by two-dimensional integration. For these and other reasons, surface emitting semiconductor lasers are utilized as light sources for writing in electrophotographic systems and light sources for optical communication.

SUMMARY

A surface emitting semiconductor laser according to an aspect of the present invention includes a substrate, a first conductivity-type first semiconductor multilayer reflector, an active layer, a semiconductor layer, a second conductivity-type second semiconductor multilayer reflector that includes a current confinement layer, and a heat dissipating metal member. In the surface emitting semiconductor laser, at least the first semiconductor multilayer reflector, the active layer, the semiconductor layer, and the second semiconductor multilayer reflector are stacked in this order on the substrate. In the surface emitting semiconductor laser, a columnar structure having a top portion, a side surface, and a bottom portion is formed so as to extend from the second semiconductor multilayer reflector to the semiconductor layer. In the surface emitting semiconductor laser, the heat dissipating metal member is connected to the semiconductor layer exposed at the bottom portion of the columnar structure.

BRIEF DESCRIPTION OF THE DRAWINGS

Exemplary embodiments of the present invention will be described in detail based on the following figures, wherein:

FIG. 4 is a perspective view of a surface emitting semiconductor laser array according to a second exemplary embodiment of the present invention;

FIGS. 9E to 9H are sectional views illustrating production processes of the surface emitting semiconductor laser array according to the exemplary embodiment of the present invention;

DETAILED DESCRIPTION

A surface emitting semiconductor laser includes a pair of distributed Bragg reflectors, an active layer between the pair of distributed Bragg reflectors, and a resonator spacer layer. These reflectors and layers are provided on a semiconductor substrate. Current is injected into the active layer through electrodes provided on both sides of the distributed Bragg reflectors, thereby causing lasing perpendicular to the substrate. Furthermore, for reducing threshold current and realizing control in a lateral mode, an oxide-confinement layer, which is formed by oxidizing a semiconductor layer that includes Al in its composition, is provided. In order to oxidize this semiconductor layer including Al, an element is etched into a mesa shape (columnar structure) and undergoes oxidation treatment. After that, a side surface of the mesa shape exposed by etching and an etched semiconductor surface are typically coated with an insulating material such as SiN or $SiO_2$. In a laser array that includes such laser elements arranged into an array, when the temperature varies from laser element to laser element, wavelengths and optical output of laser beams emitted from the individual laser elements vary in the laser array. This is not desirable when the laser array is utilized as a light source for writing in an electrophotographic system or a light source for optical communication. Thus, it is desirable that uniformity of the temperature of the entire array be improved.

Hereafter, the surface emitting semiconductor laser is referred to as a vertical cavity surface emitting laser (VCSEL). In exemplary embodiments, a VCSEL or a VCSEL array, which includes a single or plural light emitting portions formed on a substrate, is described as an example. It is noted that the figures may be emphasized so that features of the exemplary embodiments are clearly illustrated and are not necessarily drawn to scale.

Exemplary Embodiments

Figure 1:
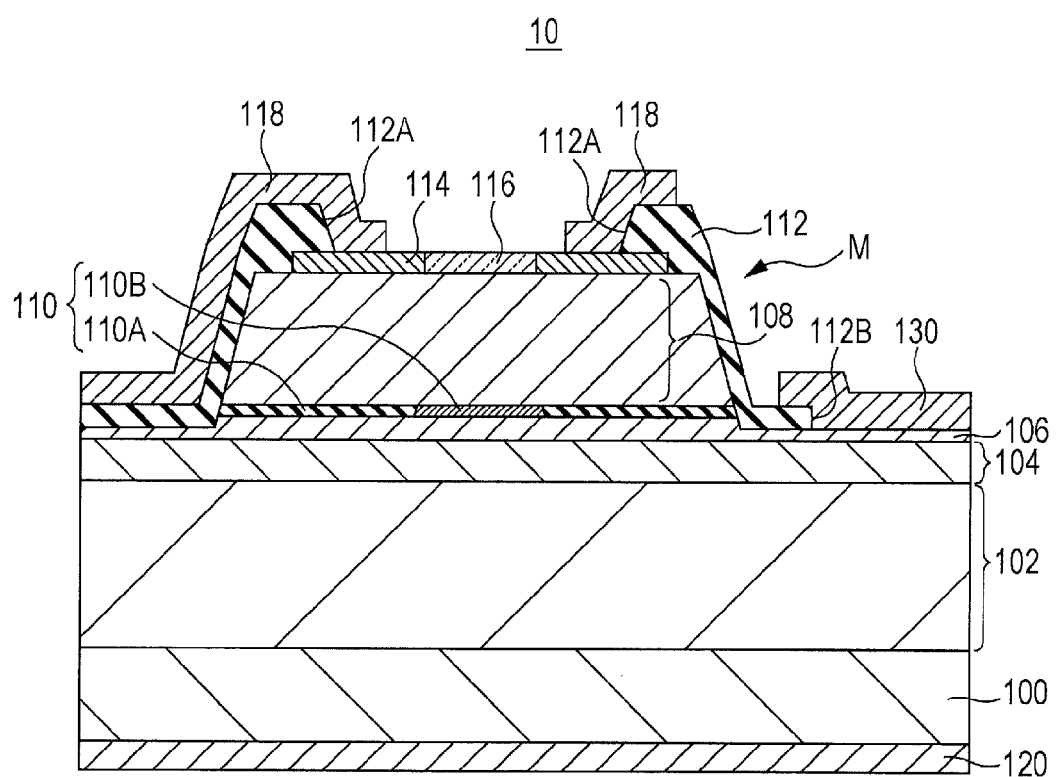
FIG. 1 is a schematic sectional view of a surface emitting semiconductor laser according to a first exemplary embodiment of the present invention.
Figure 2:
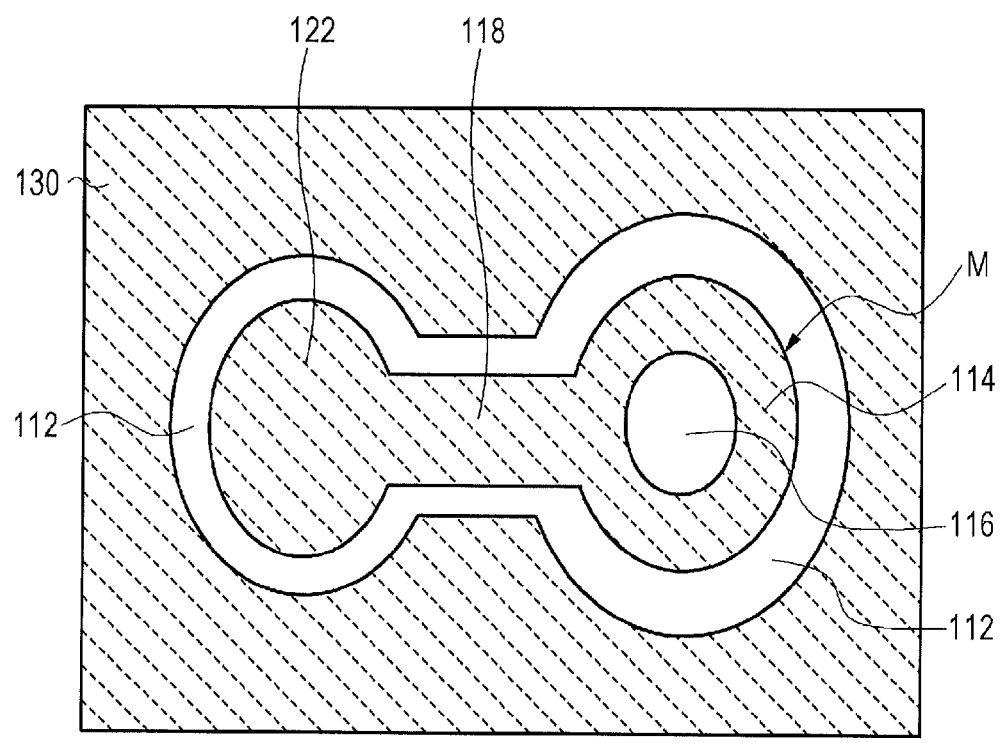
FIG. 2 is a schematic plan view of the surface emitting semiconductor laser according to the first exemplary embodiment of the present invention.

FIG. 1 is a schematic sectional view of a VCSEL element according to a first exemplary embodiment. FIG. 2 is a schematic plan view of the VCSEL element. A VCSEL 10 according to the present exemplary embodiment includes an n-type GaAs substrate 100, an n-type lower distributed Bragg reflector (simply referred to as DBR hereafter) 102, an active region 104, a p-type semiconductor layer 106, a p-type upper DBR 108. The n-type lower DBR 102 is formed by stacking AlGaAs layers having different Al composition ratios in an alternate sequence on the substrate 100. The active region 104 formed on the lower DBR 102 includes a quantum well active layer sandwiched between upper and lower spacer layers. The semiconductor layer 106 is formed on the active region 104. The upper DBR 108 is formed on the semiconductor layer 106 by stacking AlGaAs layers having different Al composition ratios in an alternate sequence.

The lower DER 102 is, for example, a multilayer structure, in which $Al_{0.9}Ga_{0.1}As$ layers and $Al_{0.3}Ga_{0.7}As$ layers are stacked in an alternate sequence, formed by performing 40 cycles of stacking of a pair of $Al_{0.9}Ga_{0.1}As$ and $Al_{0.3}Ga_{0.7}As$ layers. Each of the $Al_{0.9}Ga_{0.1}As$ layers and each of the 40 $Al_{0.3}Ga_{0.7}As$ layers are $\lambda/4n_r$ thick (k denotes an oscillation wavelength and $n_r$ denotes a refractive index). The carrier concentration after doped with silicon as an n-type impurity is, for example, $3\times10^{18}$ cm$^{-3}$.

In the active region 104, the lower spacer layer is an undoped $Al_{0.6}Ga_{0.4}As$ layer, the quantum well active layer has undoped $Al_{0.11}Ga_{0.89}As$ quantum well layers and undoped $Al_{0.3}Ga_{0.7}As$ barrier layers, and the upper spacer layer is an undoped $Al_{0.6}Ga_{0.4}As$ layer.

The semiconductor layer 106 is adjacent to a current confinement layer 110 formed as a lowest layer of the upper DBR 108. The semiconductor layer 106 transfers heat generated near the current confinement layer to a heat dissipating member 130. Thus, it is desirable that the semiconductor layer 106 be formed of a material capable of lattice matching with the GaAs substrate and has a good thermal conductivity. For example, the semiconductor layer 106 is formed of AlGaAs. When the semiconductor layer 106 is formed of AlGaAs, the thickness thereof is larger than the thickness of each of the layers of the upper DBR 108 and preferably about an odd multiple of $\lambda/4n_r$. In addition, the semiconductor layer 106 has the same Al composition ratio as that of a layer of the upper DBR 108 having a highest thermal conductivity among the layers of the upper DBR 108. The semiconductor layer 106 is desirably doped with a p-type impurity, the same type as that of the upper DBR 108. However, the semiconductor layer 106 is not necessarily a p-type layer. The semiconductor layer 106 may be a non-doped layer. The details of the semiconductor layer 106 will be described later.

The upper DBR 108 is, for example, a multilayer structure, in which $Al_{0.9}Ga_{0.1}As$ layers and $Al_{0.3}Ga_{0.7}As$ layers are stacked in an alternate sequence, formed by performing 22 cycles of stacking of a pair of $Al_{0.9}Ga_{0.1}As$ and $Al_{0.3}Ga_{0.7}As$ layers. Each of the $Al_{0.9}Ga_{0.1}As$ layers and each of the 40 $Al_{0.3}Ga_{0.7}As$ layers is $\lambda/4n_r$ thick. The carrier concentration after doped with carbon as a p-type impurity is, for example, $3\times10^{18}$ cm$^{-3}$.

As described above, the upper DBR 108 includes the current confinement layer 110, which is the lowest layer and formed adjacent to the semiconductor layer 106. The current confinement layer 110 is formed of a p-type AlAs or an AlGaAs, the Al composition ratio of which is comparatively high (for example, $Al_{0.98}Ga_{0.02}As$). The current confinement layer 110 includes an oxide region 110A, which is formed by selectively oxidizing the side surface of a mesa M, and a non-oxide region (conductive region) 110B, which is surrounded by the oxide regions. The oxide region 110A is electrically highly resistive. Optically, the refractive index of the oxide region 110A is smaller than that of the non-oxide region 110B. Thus, the current confinement layer 110 laterally confines carriers and light in the non-oxide region 110B. The upper DBR 108 may also include a p-type GaAs contact layer, the impurity concentration thereof is high.

The semiconductor layers are etched until the semiconductor layer 106 is exposed from the upper DBR 108, thereby the circular mesa (columnar structure) M is formed on the substrate. An interlayer insulation film 112 is formed so as to cover a top portion, the side surface, and a bottom portion of the mesa M. The interlayer insulation film 112 is formed of, for example, silicon oxide, silicon nitride, or the like. A contact hole 112A is formed in the interlayer insulation film 112 at the top portion of the mesa M so as to exposed an annular p-side electrode 114 from the interlayer insulation film 112. A contact hole 112B is formed in the interlayer insulation film 112 at the bottom portion of the mesa so as to expose the semiconductor layer 106 from the interlayer insulation film 112.

The p-side electrode 114 is formed at the top portion of the mesa M. The p-side electrode 114 is formed of, for example, Au, Au/Ti, or the like and electrically connected to the upper DBR 108. A circular light aperture is formed at the center of the p-side electrode 114. The light aperture is covered with an aperture protection film 116. The aperture protection film 116 is formed of a dielectric material transparent to the oscillation wavelength.

A metal wire 118 is connected to the p-side electrode 114 through the contact hole 112A of the interlayer insulation film 112. The metal wire 118 is also connected to an electrode pad 122 positioned at the side of the mesa M. The heat dissipating member 130 formed of metal is connected to the semiconductor layer 106 at the bottom portion of the mesa M through the contact hole 112B of the interlayer insulation film 112. In an example illustrated in FIG. 2, the metal wire 118, the electrode pad 122, and the heat dissipating member 130 are hatched with broken lines for ease of description. As illustrated in FIG. 2, the heat dissipating member 130 is formed so as to surround outer circumferences of the mesa M and the electrode pad 122. The heat dissipating member 130 may be formed of the same material as that of the metal wire 118 and the electrode pad 122. In this case, the heat dissipating member 130 is patterned simultaneously with the metal wire 118 and the electrode pad 122. An n-side electrode 120 is formed on a rear surface of the substrate 100. The n-side electrode 120 is electrically connected to the substrate 100 and the lower DBR 102. The n-side electrode 120 is formed of, for example, Au/Ge or the like. When a forward drive current is applied to such a VCSEL 10, laser light of about 780 nm is emitted through the light aperture of the p-side electrode 114 in a direction perpendicular to the substrate.

Figure 3A:
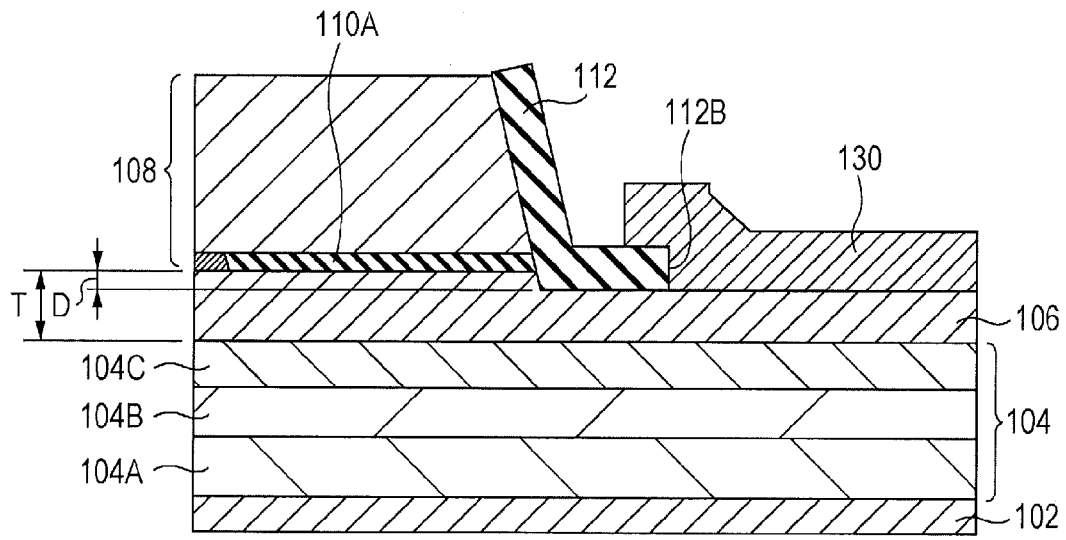
FIGS. 3A and 3B are schematic sectional views illustrating implementation of a surface emitting semiconductor laser according to the first exemplary embodiment of the present invention.
Figure 3B:
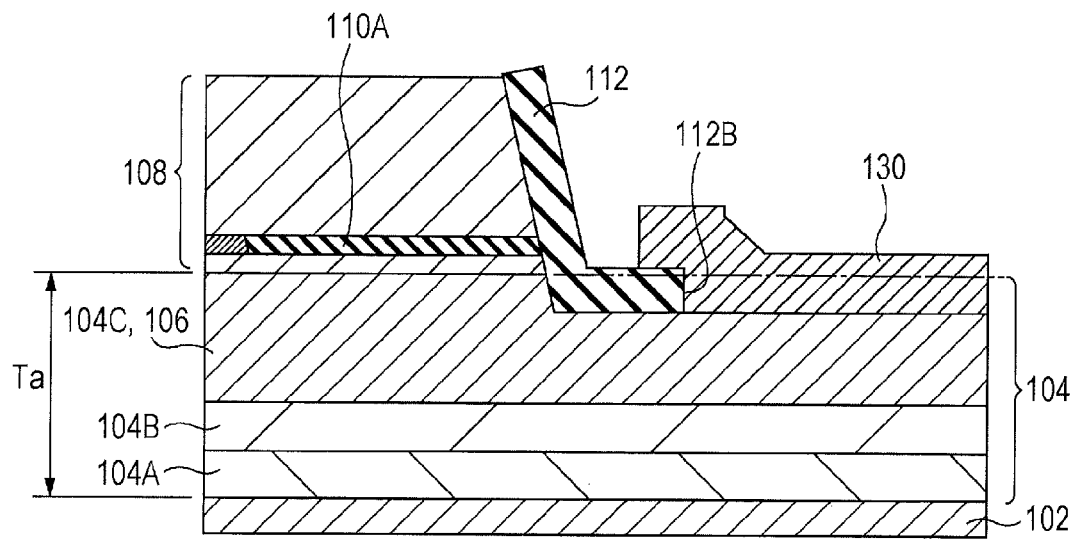
Figure 5A:
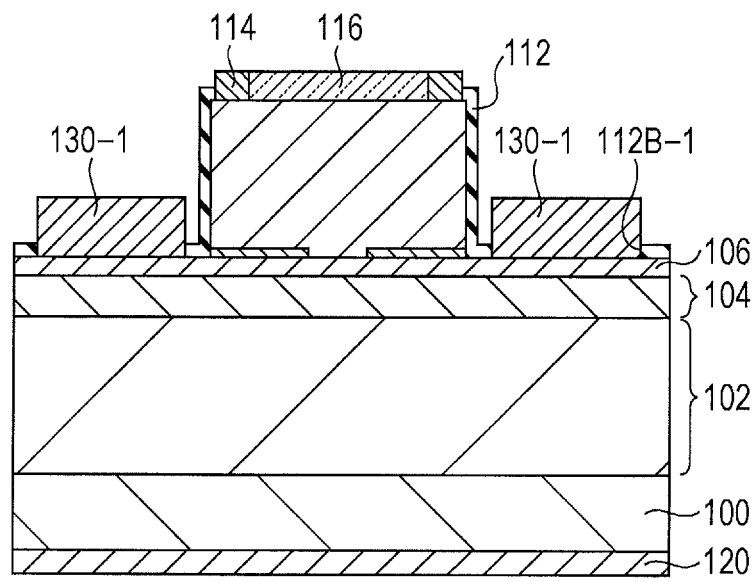
FIGS. 5A to 5D are schematic sectional views illustrating a mesa at a central portion to a mesa at a peripheral portion of the array illustrated in FIG. 4.
Figure 5B:
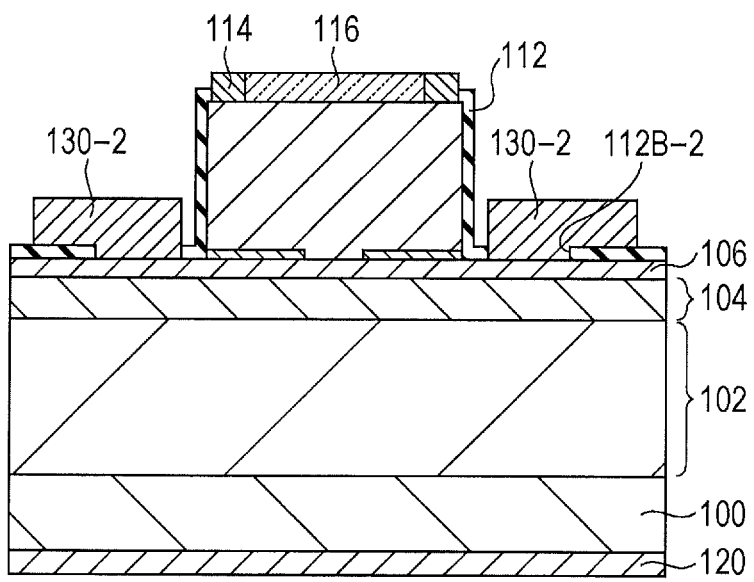
Figure 5C:
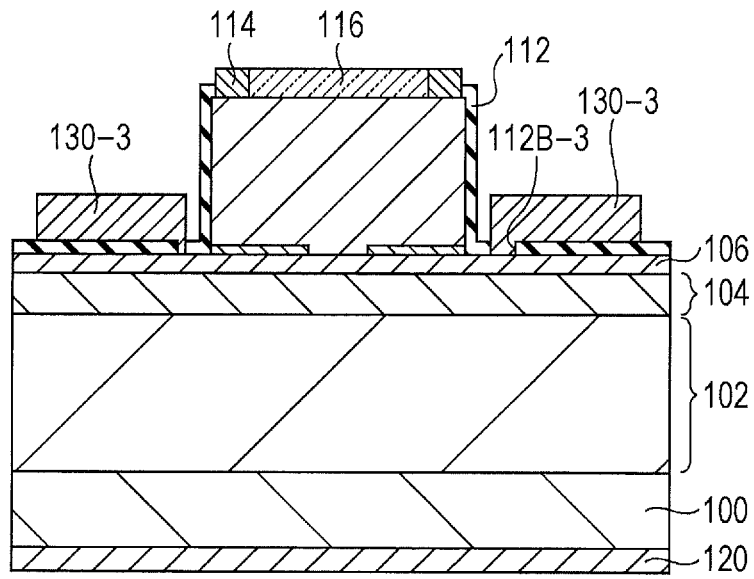
Figure 5D:
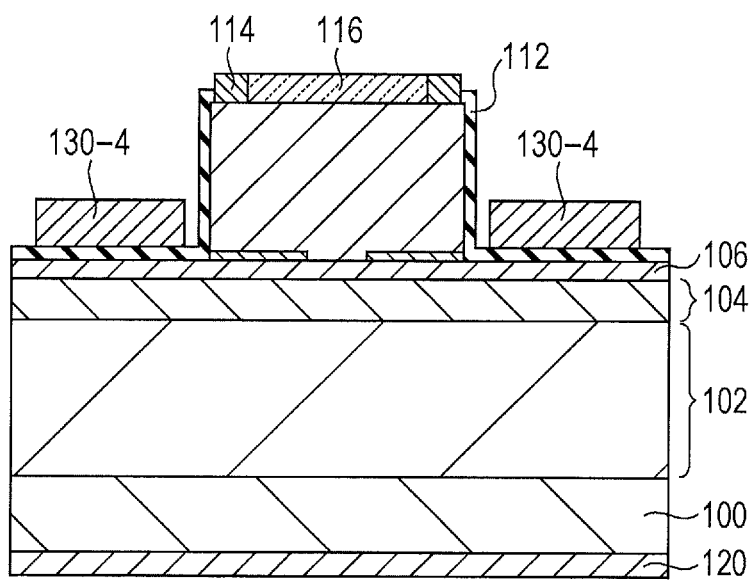

Referring next to FIGS. 3A and 3B, the details of the VCSEL according to the present exemplary embodiment are described. FIG. 3A illustrates an example in which the semiconductor layer 106 is formed between the active region 104 and the current confinement layer 110. The active region 104 includes an undoped lower spacer layer 104A, a quantum well active layer 104B, and an undoped upper spacer layer 104C. The quantum well active layer 104B has, for example, a triple-quantum well structure. The semiconductor layer 106 is formed on the upper spacer layer 104C. The current confinement layer 110, the Al composition ratio of which is high, is formed as the lowest layer of the upper DBR 108. As a result, the semiconductor layer 106 is sandwiched between the current confinement layer 110 and the upper spacer layer 104C.

Preferably, when defining the optical film thickness of the semiconductor layer 106 as T, the semiconductor layer 106 is formed to have an film thickness T that is greater than the film thickness $\lambda/4$ of each of the layers of the upper DBR 108. By setting the semiconductor layer 106 to have a large film thickness T, thermal resistance in the lateral direction is decreased. This facilitates releasing of heat generated near the current confinement layer to the heat dissipating member 130 side, thereby allowing the heat dissipation effect to be improved. The film thickness T of the semiconductor layer 106 is set to about an odd multiple of $\lambda/4$, for example, about $3\lambda/4$ in order to reduce optical loss of the upper DBR 108. In this case, the semiconductor layer 106 functions as part of the upper DBR.

Preferably, an interval or distance D between a plane where the heat dissipating member 130 and the semiconductor layer 106 are in contact with each other and the current confinement layer 110, the interval or distance being measured in a direction perpendicular to the substrate, is set to be smaller than T/2 (D<T/2). That is, when etching is performed for forming the mesa M, the etching is controlled so that a film thickness D, by which the semiconductor layer 106 is etched, is smaller than T/2, which is half the film thickness T of the semiconductor layer 106. Thus, the heat dissipating member 130 is in tight contact with the semiconductor layer 106 at a position closer to the current confinement layer 110 than a middle position between the current confinement layer 110 and the upper spacer layer 104C. This facilitates transference of heat generated near the current confinement layer to the heat dissipating member 130, thereby allowing the heat dissipation effect to be further improved.

The semiconductor layer 106 is formed to have the same composition as that of the material of one of the layers having a relatively higher thermal conductivity out of each pair of layers included in the upper DBR 108. Each pair of layers included in the upper DBR 108 includes a low refractive index layer, the Al composition ratio of which is high (for example, an $Al_{0.9}Ga_{0.1}As$ layer), and a high refractive index layer, the Al composition ratio of which is low (for example, an $Al_{0.3}Ga_{0.7}As$ layer). In the example described herein, the low refractive index layer has a higher thermal conductivity. Thus, when the upper DBR 108 is formed by epitaxial growth in a metal organic chemical vapor deposition (MOCVD) process, the semiconductor layer 106 is formed of $Al_{0.9}Ga_{0.1}As$ so as to have the same Al composition ratio as that of the low refractive index layers of the upper DBR 108 and have a film thickness of, for example, about $3\lambda/4$.

Next, another example of the configuration of the semiconductor layer according to the present exemplary embodiment is described. FIG. 3B illustrates an example in which the upper spacer layer 104C also serves as the semiconductor layer 106. The active region 104 includes the lower spacer layer 104A, the quantum well active layer 104B, and the upper spacer layer 104C/106. The lower spacer layer 104A and the quantum well active layer 104B have the same configurations as those of the related art or those illustrated in FIG. 3A. However, the upper spacer layer 104C/106 has a larger film thickness. When a cavity length Ta of the entire active region 104 in FIG. 3A is, for example, $\lambda$, the film thickness of the upper spacer layer 104C/106 is adjusted so that a cavity length Ta of the entire active region in FIG. 3B is $1.5\lambda$ or $2\lambda$.

Although the thermal conductivity of the upper spacer layer 104C, which is an undoped $Al_{0.6}Ga_{0.4}As$ layer, is decreased compared to that of the low refractive index layers ($Al_{0.9}Ga_{0.1}As$ layers) of the upper DBR 108, the film thickness thereof is larger than that of each of the layers of the upper DBR 108. Thus, heat resistance in the lateral direction is decreased, and accordingly, releasing of heat generated near the current confinement layer to the heat dissipating member 130 side is facilitated. As a result, the heat dissipation effect may be improved. The upper DBR 108 is formed so as to include at least one AlGaAs layer having a low Al composition ratio and a high refractive index between the current confinement layer 110 and the upper spacer layer 104C. This is because, when the current confinement layer is formed on the upper spacer layer 104C, an optical confinement effect is increased and an emission spectrum is enlarged, and distortion in a decrease in volume due to oxidization of the current confinement layer 110 is likely to propagate to the active layer.

The heat dissipating member 130 is connected to the semiconductor layer 106 through the contact hole 112B of the interlayer insulation film 112. However, it is not necessarily required that the connection between the heat dissipating member 130 and the semiconductor layer 106 is electrically desirable connection, that is, ohmic connection. Thus, annealing is not necessarily required after the heat dissipating member 130, which is connected to the semiconductor layer 106 or the upper spacer layer 104C, has been formed as illustrated in FIGS. 3A and 3B.

Generally, the amount of heat generation of the VCSEL element is maximum near the current confinement layer 110 in the semiconductor multilayer structure. Since the heat dissipating member 130 is formed on the semiconductor layer 106 on the same side as the current confinement layer 110, heat dissipation efficiency is improved. If the semiconductor layer 106 is formed on a side different from the current confinement layer 110 side, that is, on the opposite DER side with respect to the active region 104, the distance between the semiconductor layer 106 and the current confinement layer is increased. This reduces thermal coupling, and accordingly, an effective heat dissipation effect is not obtained.

Although the oscillation wavelength of the VCSEL in the example is in a 780 nm band in the above-described exemplary embodiment, the oscillation wavelength band of the VCSEL is not limited to this and may be an 850 nm band or a 980 nm band. In this case, the materials of the semiconductor layers to be stacked are appropriately selected in accordance with the oscillation wavelength.

Next, a VCSEL array according to a second exemplary embodiment of the present invention is described. The VCSEL array according to the second exemplary embodiment includes plural mesas M as illustrated in FIG. 1 on a substrate. FIG. 4 is a schematic perspective view of a VCSEL array 12 according to the second exemplary embodiment seen from above. As illustrated in FIG. 4, the VCSEL array 12 includes the plural mesas M on the substrate. The mesas M are arranged in a two-dimensional array. In an example illustrated in FIG. 4, the mesas M serving as light emitting portions are arranged in a four-row by eight-column array. Each of the mesas M is surrounded by a corresponding one of the rectangular heat dissipating members 130 formed therearound. Thus, the heat dissipating members 130 are also arranged in a four-row by eight-column array. Solid rectangles in FIG. 4 each represent a portion where a corresponding one of the heat dissipating members 130 is exposed to air. Broken rectangles in FIG. 4 each represent a portion where the heat dissipating member 130 is in contact with a semiconductor layer (in other words, the size of the contact hole 112B of the interlayer insulation film 112). The surface areas of the heat dissipating members 130 are substantially equal to one another. With the rectangular heat dissipating members 130, the distances between the heat dissipating members 130 are decreased compared to the case where the heat dissipating members 130 have a circular shape, and accordingly, the heat dissipation effect may be improved. The p-side electrodes of the mesas M have the respective metal wires 118. The metal wires 118 are connected to electrode pads, which are not illustrated.

FIGS. 5A to 5D are schematic sectional views respectively illustrating a mesa M1, a mesa M2, a mesa M3, and a mesa M4. The mesa M1 is disposed at a central portion of the array illustrated in FIG. 4; the mesa M2 is adjacent to the mesa M1; the mesa M3 is adjacent to the mesa M2; and the mesa M4 adjacent to the mesa M3 is disposed at a peripheral portion of the array. The lower DBR 102, the active region 104, the semiconductor layer 106, the current confinement layer 110, and the upper DBR 108 are stacked on the substrate 100, thereby the mesas M that define the light emitting portions are formed. A heat dissipating member 130-1, which is formed at the bottom portion of the mesa M1 at the central portion of the array, is connected to the semiconductor layer 106 through a contact hole 112B-1 of the interlayer insulation film 112. The heat dissipating members 130-2 and 130-3 formed at the bottom portions of the other mesas M2 and M3 are similarly connected to the semiconductor layer 106 through the respective contact holes 112B-2 and 112B-3. Here, it is noted that the sizes of the contact holes 112B-1, 112B-2, and 112B-3 are decreased stepwise from the central portion toward the peripheral portion of the array. In other words, a contact area, by which the heat dissipating member 130-1 is in contact with the semiconductor layer 106, is large in the mesa M1 at the central portion of the array, and contact areas, by which the heat dissipating members 130-2 and 130-3 are in contact with the semiconductor layer 106, are decreased toward the peripheral portion of the array. The heat dissipating member 130-4 is not in direct contact with the semiconductor layer 106. That is, the contact hole is not formed in this portion. The semiconductor layer 106 has a higher thermal conductivity than that of the interlayer insulation film 112. The heat release by the heat dissipating member 130-1 at the central portion of the array is increased compared to those by the heat dissipating members 130-3 and 130-4 at the peripheral portion of the array in proportion to the contact areas. With heat dissipation property varied corresponding to positions in the array as described above, the temperature of the entire array may become uniform. The shape of the contact holes formed in the interlayer insulation film 112 is not particularly limited. The contact holes may be formed to have an arbitrary shape. It is sufficient that the contact areas, by which the heat dissipating members and the semiconductor layer 106 are in contact with one another, be decreased from the central portion toward the peripheral portion of the array.

Figure 6:
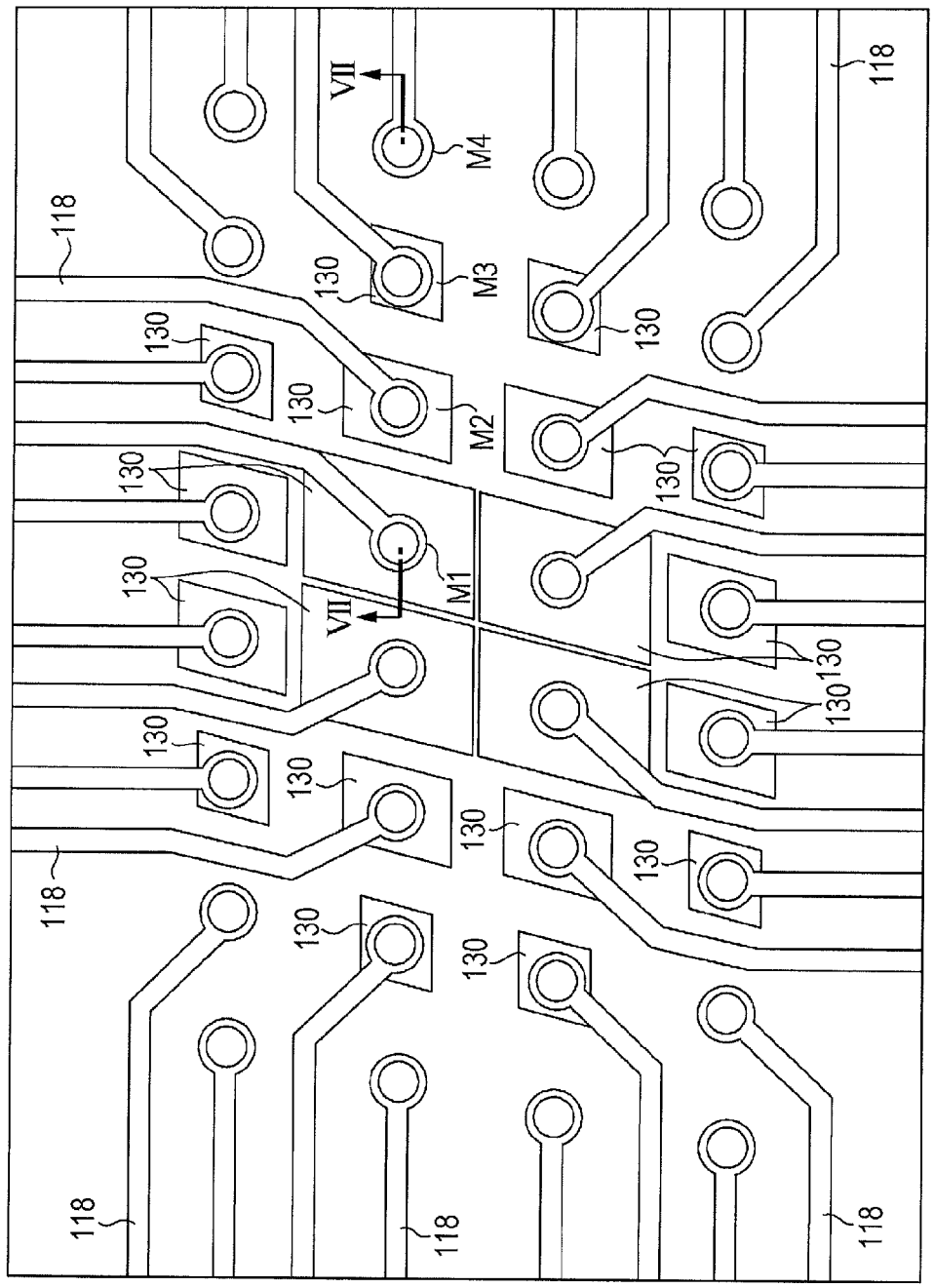
FIG. 6 is a perspective view of a surface emitting semiconductor laser array according to a third exemplary embodiment of the present invention.
Figure 7:
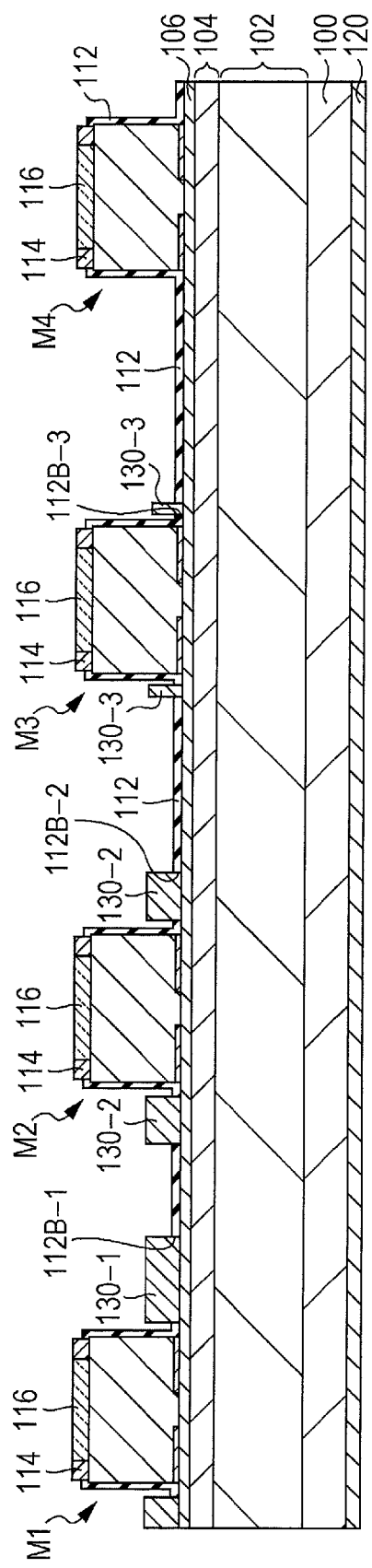
FIG. 7 is a schematic sectional view illustrating a mesa at a central portion to a mesa at a peripheral portion of the array illustrated in FIG. 6.

Next, a VCSEL array according to a third exemplary embodiment of the present invention is described. In the third exemplary embodiment, the areas (surface areas), by which the heat dissipating members are exposed to air, are decreased stepwise from the center toward the periphery of the VCSEL array according to the second exemplary embodiment. FIG. 6 is a perspective view of a VCSEL array 14 according to the third exemplary embodiment. FIG. 7 is a schematic sectional view illustrating the mesa M1, the mesa M2, the mesa M3, and the mesa M4. The mesa M1 is disposed at a central portion of the array illustrated in FIG. 6; the mesa M2 is adjacent to the mesa M1; the mesa M3 is adjacent to the mesa M2; and the mesa M4 is disposed at a peripheral portion of the array. As illustrated in FIGS. 6 and 7, the contact areas by which the heat dissipating members 130-1, 130-2, and 130-3 are in contact with the semiconductor layer 106 (or, the sizes of the contact holes 112B-1, 112B-2, and 112B-3) are decreased from the center toward the periphery of the array, and the surface areas or the sizes of outer shapes of the heat dissipating members 130-1, 130-2, 130-3 are decreased from the center toward the periphery of the array. There is no heat dissipating member formed for the mesa M4. Thus, heat release is decreased stepwise from the central portion toward the peripheral portion of the array. As a result, the temperature of the entire array may become uniform. The shape of the heat dissipating members 130 is not particularly limited. The heat dissipating members 130 may be formed to have an arbitrary shape.

Figure 8A:
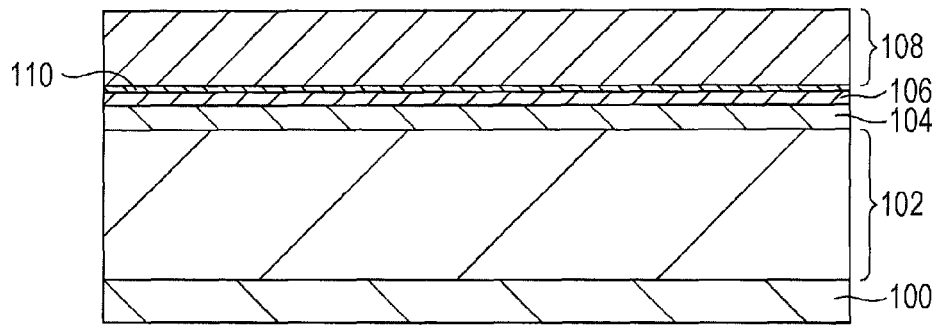
FIGS. 8A to 8D are sectional views illustrating production processes of the surface emitting semiconductor laser array according to the exemplary embodiment of the present invention.

Next, a method of producing a VCSEL array according to the second or third exemplary embodiment of the present invention is described with reference to FIGS. 8A to 10K illustrating sectional views of production processes. Initially, as illustrated in FIG. 8A, by using a metal organic vapor phase epitaxy (MOVPE) method, group III-V compound (GaAs, AlGaAs, and AlAs) semiconductor films are sequentially epitaxially grown and stacked on the n-type GaAs substrate. The structure of stacked thin films includes, for example, the following layers: the lower DBR 102 that includes 40 pairs of the n-type $Al_{0.9}Ga_{0.1}As$ and $Al_{0.3}Ga_{0.7}As$ layers; the active region 104 that includes the lower spacer layer 104A formed of undoped $Al_{0.6}Ga_{0.4}As$, the quantum well active layer 104B formed of the undoped $Al_{0.11}Ga_{0.89}As$ quantum well layers and the undoped $Al_{0.3}Ga_{0.7}As$ barrier layers, and the upper spacer layer 104C formed of the undoped $Al_{0.6}Ga_{0.4}As$ layer; the p-type semiconductor layer 106 that has a thickness of about 3λ/4 and is formed of $Al_{0.9}Ga_{0.1}As$; the p-type AlAs current confinement layer 110; and the upper DBR 108 that includes 22 pairs of the p-type $Al_{0.9}Ga_{0.1}As$ and $Al_{0.3}Ga_{0.7}As$ layers.

Figure 8B:
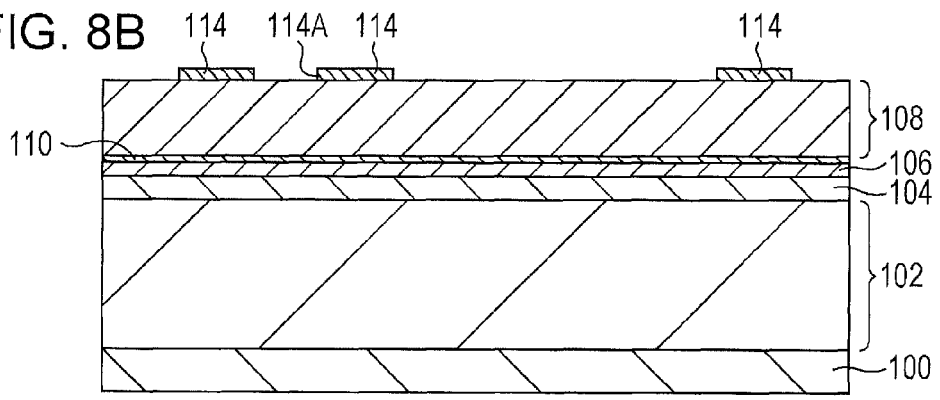
Figure 8C:
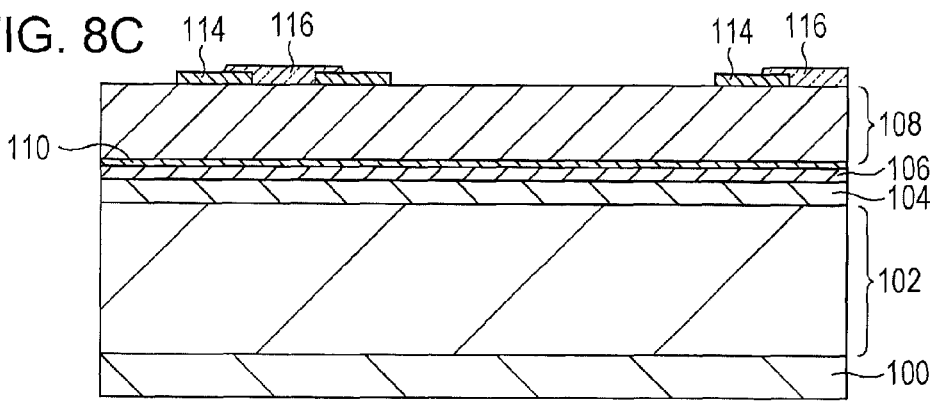
Figure 8D:
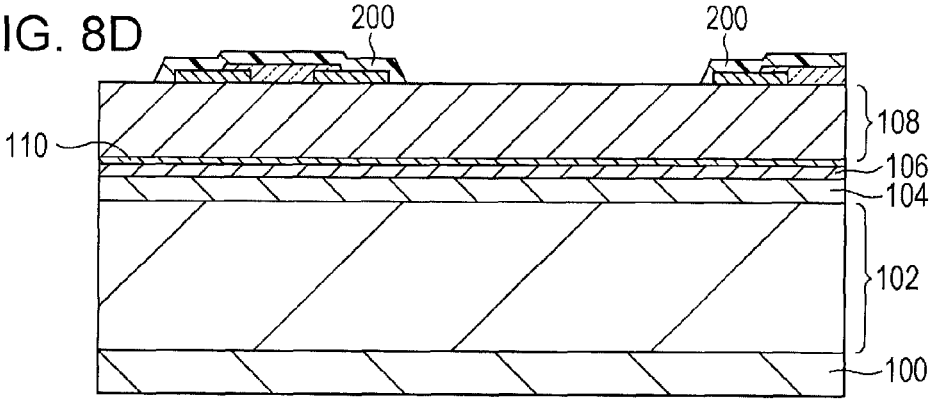

Next, as illustrated in FIG. 8B, the p-side electrodes 114 each having a circular light aperture 114A at its center are formed on the upper DBR 108 by a liftoff method. After the p-side electrodes 114 have been formed, the resultant structure is annealed at a constant temperature so as to obtain a good electrical connection between the p-side electrodes 114 and the upper DBR 108. Next, as illustrated in FIG. 8C, the aperture protection films 116 are formed to have a specified film thickness by a known photo-lithographic process so that the aperture protection films 116 cover the light apertures 114A at the centers of the respective p-side electrodes 114. The aperture protection films 116 are formed of, for example, SiON. Next, SiN is formed entirely on a surface of the substrate, and an etching mask 200 for mesa formation as illustrated in FIG. 8D is formed by a known photo-lithographic method.

After the mesas have been formed, as illustrated in FIG. 9E, the stacked semiconductor layers are subjected to anisotropic etching with the etching mask 200 so as to form the columnar mesas M that extends from the upper DBR 108 to the semiconductor layer 106. The semiconductor layers are etched by a depth so as to reach the semiconductor layer 106, and preferably, the depth is in the following range as illustrated in FIG. 3A: D<T/2.

Next, as illustrated in FIG. 9F, an oxidation process is performed by exposing the substrate to, for example, a water vapor atmosphere at 340° C. for a certain period of time. The oxidizing velocity of the AlAs layer (current confinement layer) 110 is notably higher than those of the $Al_{0.9}Ga_{0.1}As$ layers and the $Al_{0.3}Ga_{0.7}As$ layers of the upper DBR 108. Thus, the oxide region 110A is formed from the side surface of each of the mesas M such that the shape of the mesa is reflected in the oxide region 110A. The non-oxide region 110B, which remains non-oxidized, forms a current injection region or a conducting region.

Figure 10I:
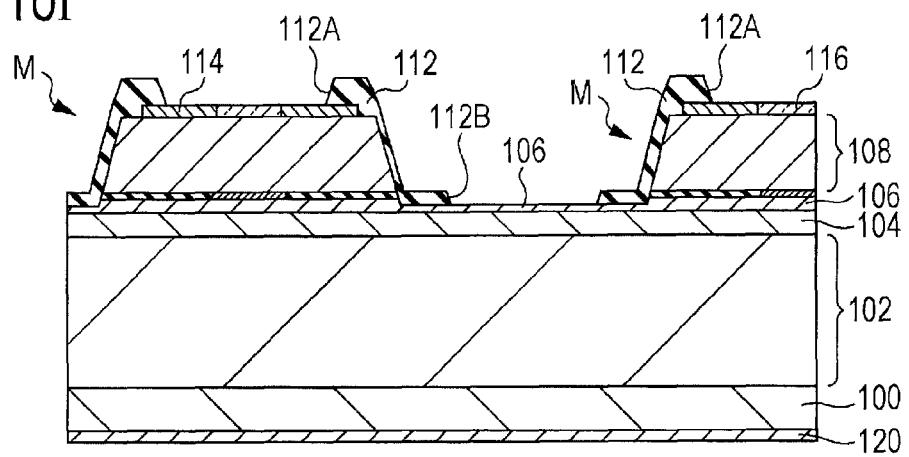
FIGS. 10I to 10K are sectional views illustrating production processes of the surface emitting semiconductor laser array according to the exemplary embodiment of the present invention.

Next, after the etching mask 200 has been removed, the interlayer insulation film 112 of SiN, SiON or the like is formed entirely over the surface of the substrate as illustrated in FIG. 9G. Then, as illustrated in FIG. 9H, the n-side electrode 120 of Au/Ge or the like is formed on the rear surface of the substrate 100. After the n-side electrode has been formed, the resultant structure is annealed at a constant temperature so as to allow the n-side electrode 120 to be electrically desirably connected to the substrate 100. Next, as illustrated in FIG. 10I, the contact holes 112A are formed in the interlayer insulation film 112 at the top portions of the mesas M, and, at the same time, the contact holes 112B are formed in the interlayer insulation film 112 at the bottom portions of the mesas M. The p-side electrodes 114 and the aperture protection films 116 are exposed through the contact holes 112A. The semiconductor layer 106 is exposed through the contact holes 112B.

Figure 10J:
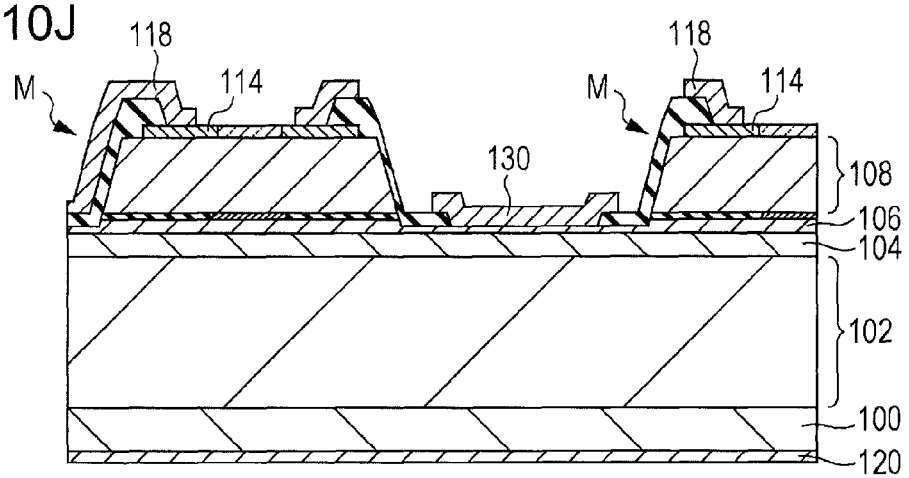

Next, as illustrated in FIG. 10J, the metal wires 118 are patterned such that the metal wires 118 are connected to the p-side electrodes 114 through the contact holes 112A, and the heat dissipating members 130 are patterned such that the heat dissipating members 130 are connected to the semiconductor layer 106 through the contact holes 112B. The metal wires 118 and the heat dissipating members 130 may be formed by the same material through the same process, for example, a liftoff process. Furthermore, the metal wires 118 and the heat dissipating members 130 may be formed of the same material as that of the p-side electrodes 114, for example, Ti/Au. Here, annealing is not required after the metal wires 118 and the heat dissipating members 130 have been formed. In this case, the heat dissipating members 130, which are in Schottky contact with the semiconductor layer 106 and not ohmically connected to the semiconductor layer 106, are thermally desirably coupled to the semiconductor layers 106. Furthermore, although it is not illustrated here, the electrode pads are formed in the same process as that of forming the metal wires 118. Then, the substrate is subjected to dicing so as to be cut into VCSEL array chips. Thus, the VCSEL arrays 12 or 14 according to the second or third embodiment may be obtained.

Figure 10K:
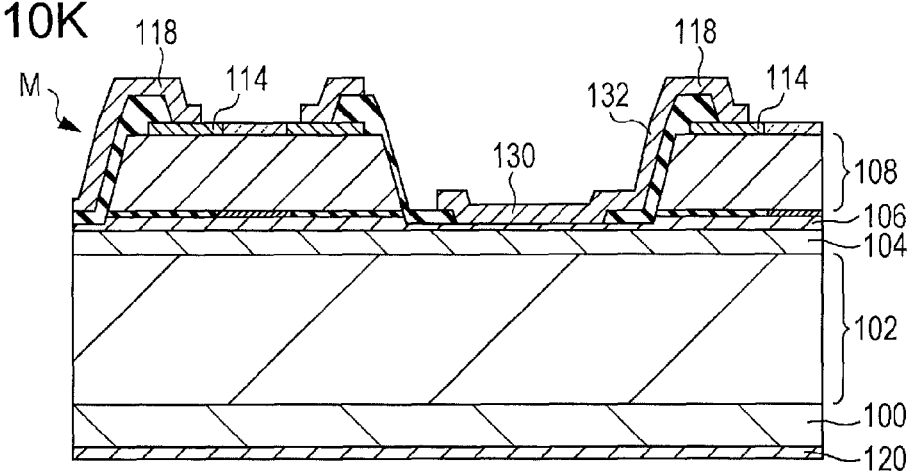

FIG. 10K illustrates an example of the configuration of another VCSEL array. In the configuration illustrated in FIG. 10J, the heat dissipating members 130 and the metal wires 118 are patterned so that the heat dissipating members 130 and the metal wires 118 are separated from one another. In the configuration illustrated in FIG. 10K, for each of the mesas M, the heat dissipating member 130 is connected to the metal wire 118 of the mesa M through a connection electrode 132. The connection electrode 132 extends on the interlayer insulation film 112 in the side surface of each of the mesas M. That is, each of the metal wires 118 and a corresponding one of the heat dissipating members 130 are integrated with each other to form a common component. Since electrical conduction between the heat dissipating members 130 and the semiconductor layer 106 is not necessarily required, the heat dissipating members 130 may be connected to the metal wires 118. Thus, with the connection electrodes 132 formed on the side surfaces of the mesas M, heat dissipation characteristics are further improved.

Next, a surface emitting semiconductor laser device, an optical information processing apparatus, and an optical transmission device, in which the VCSEL or the VCSEL array according to the exemplary embodiments herein is utilized, are described with reference to the drawings.

Figure 11:
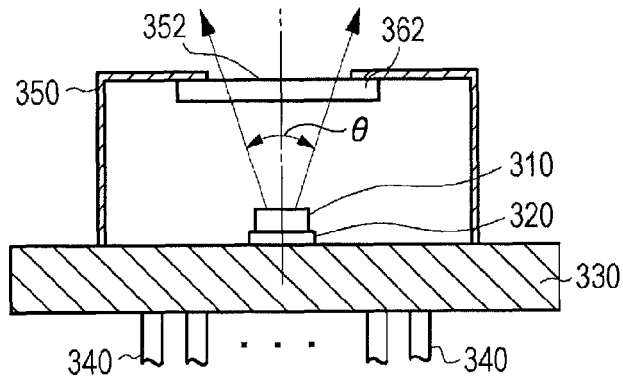
FIG. 11 is a schematic sectional view illustrating the configuration of a surface emitting semiconductor laser device in which the surface emitting semiconductor laser or the surface emitting semiconductor laser array according to the present exemplary embodiment and an optical member are packaged.

FIG. 11 is a sectional view illustrating the configuration of a surface emitting semiconductor laser device formed by packaging the VCSEL and optical members. A surface emitting semiconductor laser device 300 includes a chip 310, in which the single VCSEL element or the VCSEL array is formed, and a disc-shaped metal stem 330. The chip 310 is secured onto the metal stem 330 with an electrically conductive adhesive 320. Plural electrically conductive leads 340 are inserted into respective through holes (not illustrated) formed in the stem 330. The leads 340 are electrically connected to respective electrode pads 60 and the n-side electrodes 120 of the chip 310. A rectangular hollow cap 350 is secured on the stem 330 and the chip 310. A glass plate 362 is secured at an opening 352 at the center of the cap 350. When a forward drive current is applied between the selected leads 340, laser light is emitted from the chip 310 in the vertical direction. The distance between the chip 310 and the glass plate 362 is adjusted so that the laser light emitted from the chip 310 and diverging at a divergent angle θ is entirely incident upon the glass plate 362. Furthermore, a photo receiving element or a temperature sensor that monitors a light emission state may be provided in the cap 350.

Figure 12:
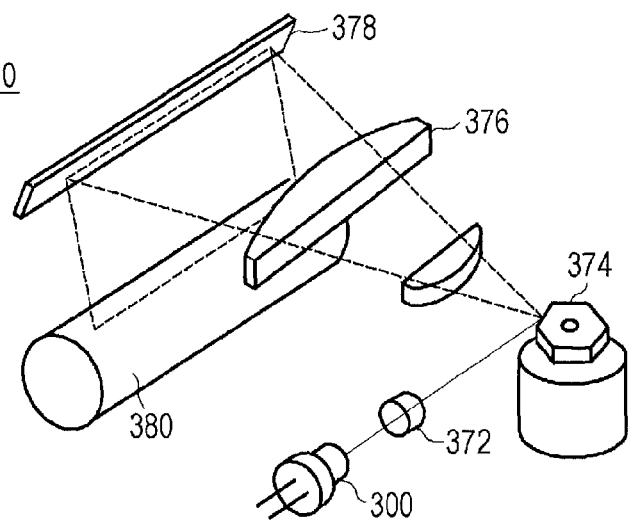
FIG. 12 illustrates an example of a configuration of a light source device in which the surface emitting semiconductor laser or the surface emitting semiconductor laser array according to the present exemplary embodiment are used.

FIG. 12 illustrates an example in which the VCSEL is applied to a light source of an optical information processing apparatus. As illustrated in FIG. 11, an optical information processing apparatus 370 includes a collimator lens 372, a polygon mirror 374, an fθ lens 376, a linear reflection mirror 378, and a photoconductor drum (recording medium) 380. The laser light from the surface emitting semiconductor laser device 300, which is formed by packaging a single VCSEL or the VCSEL array, is incident upon the collimator lens 372. The polygon mirror 374 is rotated at a constant speed and reflects a light beam from the collimator lens 372 so that the light beam diverges at a constant angle. The laser light from the polygon mirror 374 is incident upon the fθ lens 376. The reflection mirror 378 is irradiated with the laser light from the fθ lens 376. A latent image is formed on the photoconductor drum 380 in accordance with the reflected light from the reflection mirror 378. Thus, the optical image processing apparatus may use the surface emitting semiconductor laser device 300 as the light source. Examples of the optical information processing apparatus, which includes an optical system that condenses the laser light from the surface emitting semiconductor laser device 300 on the photoconductor drum 380 and a mechanism that causes the condensed laser light to scan the photoconductor drum 380, includes copiers and printers.

Figure 13:
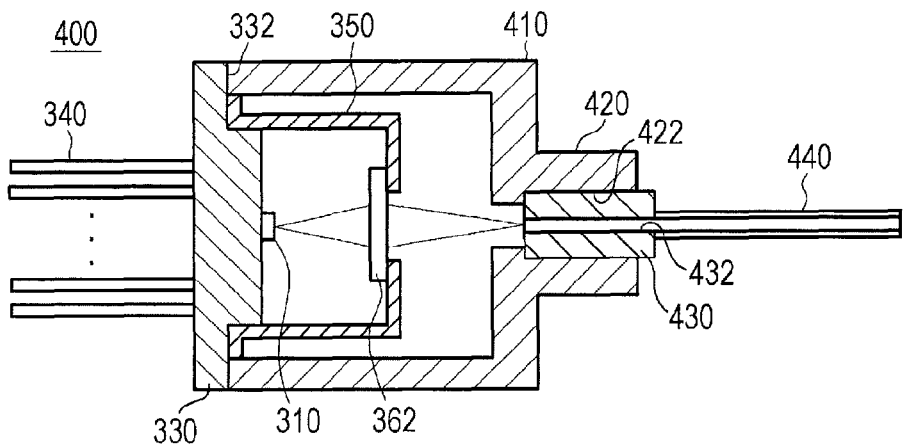
FIG. 13 is a schematic sectional view illustrating a configuration of an optical transmission device in which the surface emitting semiconductor laser device illustrated in FIG. 11 is used.

FIG. 13 is a sectional view of the configuration in which the VCSEL illustrated in FIG. 11 is applied to an optical transmission device. An optical transmission device 400 includes a cylindrical housing 410, a sleeve 420, a ferrule 430, and an optical fiber 440. The housing 410 is secured to the stem 330. The sleeve 420 at an end surface of the housing 410 is integrally formed with the housing 410. The ferrule 430 is held in an opening 422 of the sleeve 420. The optical fiber 440 is held by the ferrule 430. An end portion of the housing 410 is secured to a flange 332 formed in the circumferential direction of the stem 330. The ferrule 430 is exactly positioned with respect to the opening 422 of the sleeve 420, thereby aligning the optical axis of the optical fiber 440 with a substantially central position of the glass plate 362. A core wire of the optical fiber 440 is held in a through hole 432 of the ferrule 430. The laser light emitted from the surface of the chip 310 is incident upon the core wire of the optical fiber 440 through the glass plate 362 and transmitted. The optical transmission device 400 may also include a drive circuit that applies electrical signals to the leads 340. The optical transmission device 400 may also include a receiving function that receives optical signals through the optical fiber 440.

The foregoing description of the exemplary embodiments of the present invention has been provided for the purposes of illustration and description. It is not intended to be exhaustive or to limit the invention to the precise forms disclosed. It will be apparent to practitioners skilled in the art that, obviously, many modifications and variations are possible without departing from the gist of the present invention described in the claims. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface emitting semiconductor laser comprising:
    a substrate;
    a first conductivity-type first semiconductor multilayer reflector;
    an active layer;
    a semiconductor layer;
    a second conductivity-type second semiconductor multilayer reflector that includes a current confinement layer;
    a heat dissipating metal member,
    wherein at least the first semiconductor multilayer reflector, the active layer, the semiconductor layer, and the second semiconductor multilayer reflector are stacked one on top of another in this order on the substrate,
    wherein a columnar structure having a top portion, a side surface, and a bottom portion is formed so as to extend from the second semiconductor multilayer reflector to the semiconductor layer, and
    wherein the heat dissipating metal member is connected to the semiconductor layer exposed at the bottom portion of the columnar structure; and
    a first electrode formed at a top portion of the columnar structure; and
    a second electrode formed at a rear surface of the substrate.

2. The surface emitting semiconductor laser according to claim 1,
    wherein, when $\lambda$ denotes an oscillation wavelength, a film thickness of the semiconductor layer measured as an optical path length is greater than $\lambda/4$ and about an odd multiple of $\lambda/4$.

3. The surface emitting semiconductor laser according to claim 1,
    wherein the second semiconductor multilayer reflector includes
        a pair of layers exhibiting thermal conductivities being different from each other, and
    wherein a composition of the semiconductor layer is the same as a composition of a material of one of the pair of layers exhibiting the comparatively high thermal conductivity.

4. The surface emitting semiconductor laser according to claim 1,
    wherein the semiconductor layer is a spacer layer formed on the active layer.

5. The surface emitting semiconductor laser according to claim 1, further comprising:
    an interlayer insulation film, the bottom portion, the side surface, and the top portion of the columnar structure are coated with the interlayer insulation film, the interlayer insulation film having openings at portions thereof at the top and the bottom portions of the columnar structure; and
    a wiring electrode formed through the opening of the interlayer insulation film at the top portion of the columnar structure;
    wherein the heat dissipating metal member is connected to the semiconductor layer through the opening of the interlayer insulation film at the bottom portion of the columnar structure, and
    wherein a material of the wiring electrode and a material of the heat dissipating metal member are the same.

6. A surface emitting semiconductor laser array comprising:
    a plurality of the columnar structures according to claim 1, the plurality of columnar structures being arranged in an array having a central portion and a peripheral portion,
    wherein a contact area by which the semiconductor layer is in contact with the heat dissipating metal member formed at the bottom portion of the columnar structure at the central portion of the array is greater than a contact area by which the semiconductor layer is in contact with the heat dissipating metal member formed at the bottom portion of the columnar structure at the peripheral portion of the array.

7. The surface emitting semiconductor laser array according to claim 6,
    wherein a surface area of the heat dissipating metal member formed at the bottom portion of the columnar structure at the central portion of the array is greater than a surface area of the heat dissipating metal member formed at the bottom portion of the columnar structure at the peripheral portion of the array.

8. A surface emitting semiconductor laser device comprising:
    the surface emitting semiconductor laser array according to claim 6; and
    an optical member, light from the surface emitting semiconductor laser array being incident upon the optical member, the surface emitting semiconductor laser array and the optical component being packaged.

9. An optical transmission device comprising:
    the surface emitting semiconductor laser device according to claim 8; and
    a transmission unit that transmits laser light emitted from the surface emitting semiconductor laser device through an optical medium.

10. An information processing apparatus comprising:
    the surface emitting semiconductor laser array according to claim 6;
    a light condensing unit that condenses laser light emitted from the surface emitting semiconductor laser array on an recording medium; and
    a mechanism that causes the laser light condensed by the light condensing unit to scan the recording medium.

11. A surface emitting semiconductor laser device comprising:
the surface emitting semiconductor laser according to claim 1; and
an optical member, light from the surface emitting semiconductor laser being incident upon the optical member, the surface emitting semiconductor laser and the optical component being packaged.

12. An optical transmission device comprising:
the surface emitting semiconductor laser device according to claim 11; and
a transmission unit that transmits laser light emitted from the surface emitting semiconductor laser device through an optical medium.

13. An information processing apparatus comprising:
the surface emitting semiconductor laser according to claim 1;
a light condensing unit that condenses laser light emitted from the surface emitting semiconductor laser on an recording medium; and
a mechanism that causes the laser light condensed by the light condensing unit to scan the recording medium.

14. The surface emitting semiconductor laser according to claim 1,
wherein the columnar structure extends from the second semiconductor multilayer reflector to physically contact the semiconductor layer.

15. The surface emitting semiconductor laser according to claim 1,
wherein the heat dissipating metal member physically contacts the semiconductor layer.

16. A surface emitting semiconductor laser comprising:
a substrate;
a first conductivity-type first semiconductor multilayer reflector;
an active layer;
a semiconductor layer;
a second conductivity-type second semiconductor multilayer reflector that includes a current confinement layer; and
a heat dissipating metal member,
where at least the first semiconductor multilayer reflector, the active layer, the semiconductor layer, and the second semiconductor multilayer reflector are stacked one on top of another in this order on the substrate,
wherein a columnar structure having a top portion, a side surface, and a bottom portion is formed so as to extend from the second semiconductor multilayer reflector to the semiconductor layer,
wherein the heat dissipating metal member is connected to the semiconductor layer exposed at the bottom portion of the columnar structure, and
wherein a distance between the current confinement layer and a plane where the heat dissipating metal member is in contact with the semiconductor layer is smaller than $\frac{1}{2}$ times a film thickness of the semiconductor layer.

17. A method of producing a surface emitting semiconductor laser comprising:
forming at least a first conductivity-type first semiconductor multilayer reflector, an active layer, a semiconductor layer, and a second conductivity-type second semiconductor multilayer reflector that includes a current confinement layer so as to be stacked one on top of another in this order on a substrate;
forming a columnar structure that has a top portion and a bottom portion and extends from the second semiconductor multilayer reflector to the semiconductor layer;
forming a first electrode at a top portion of the columnar structure;
forming a second electrode at a rear surface of the substrate;
forming an insulation film and coating the columnar structure with the insulation film;
forming a first opening in the insulation film so that the semiconductor layer is exposed at the bottom portion of the columnar structure; and
forming a heat dissipating metal member and connecting the heat dissipating metal member to the semiconductor layer exposed through the first opening.

18. The method according to claim 17, further comprising:
forming a second opening in the insulation film so that the top portion of the columnar structure is exposed,
wherein the forming of the second opening and the forming of the first opening are simultaneously performed.

19. The method according to claim 18, further comprising:
forming a wiring electrode and connecting the wiring electrode through the second opening,
wherein the connecting of the wiring electrode and the connecting of the heat dissipating metal member are simultaneously performed.

* * * * *